(12) United States Patent
He

(10) Patent No.: US 7,755,913 B2
(45) Date of Patent: Jul. 13, 2010

(54) DISK DRIVE CAGE WITH SHIELDING MEMBER

(75) Inventor: Yu-Wei He, Shenzhen (CN)

(73) Assignees: Hong Fu Jin Precision Industry (ShenZhen) Co. Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 488 days.

(21) Appl. No.: 11/858,129

(22) Filed: Sep. 20, 2007

(65) Prior Publication Data

US 2009/0059551 A1 Mar. 5, 2009

(30) Foreign Application Priority Data

Aug. 28, 2007 (CN) .................... 2007 2 0200888 U

(51) Int. Cl.
*H05K 9/00* (2006.01)
(52) U.S. Cl. ................ 361/816; 361/800; 361/818; 361/753; 361/799; 174/350; 174/377
(58) Field of Classification Search ............... 361/753, 361/799, 800, 816, 818; 174/350, 351, 354, 174/377
See application file for complete search history.

(56) References Cited

U.S. PATENT DOCUMENTS

| | | | | |
|---|---|---|---|---|
| 5,744,213 A | * | 4/1998 | Nelson | 428/131 |
| 5,802,699 A | * | 9/1998 | Fjelstad et al. | 29/593 |
| 5,812,378 A | * | 9/1998 | Fjelstad et al. | 361/769 |
| 6,292,373 B1 | * | 9/2001 | Li et al. | 361/800 |
| 6,359,768 B1 | * | 3/2002 | Eversley et al. | 361/212 |
| 6,654,256 B2 | * | 11/2003 | Gough | 361/816 |
| 7,118,389 B2 | * | 10/2006 | Fork et al. | 439/74 |
| 7,561,444 B2 | * | 7/2009 | He | 361/818 |
| 7,593,240 B2 | * | 9/2009 | Kao | 361/807 |
| 2005/0282411 A1 | * | 12/2005 | Fork et al. | 439/74 |
| 2008/0043454 A1 | * | 2/2008 | Titus | 361/818 |

* cited by examiner

*Primary Examiner*—Dameon E Levi
(74) *Attorney, Agent, or Firm*—Frank R. Niranjan

(57) ABSTRACT

A disk drive cage comprises a bracket (3) and a shielding member (1). The bracket comprises a top wall (31) and a securing wall (32) parallel to the top wall. The securing wall defines a plurality of securing holes (321) therein. The shielding member comprises a shielding cover (20) and a bezel (10) attached to the shielding cover. The shielding cover defines a plurality of cross-shaped slots (23). Each cross-shaped slot comprises a first slot (231) and a second slot (232) crossing the first slot. A receiving area (236) is defined in a crossing portion formed by the first and second slots. The bezel comprises a plurality of securing posts (12) interferentially engaging with the plurality of cross-shaped slots, and a plurality of hooks (162) engaging with the securing holes of the securing wall of the bracket. Each securing post comprises a securing portion (124). The securing portion is larger in cross-section than the receiving area. The shielding member is mounted between the top wall and the securing wall.

10 Claims, 5 Drawing Sheets

DISK DRIVE CAGE WITH SHIELDING MEMBER

BACKGROUND

1. Technical Field

The present invention relates to disk drive cages, and more particularly to a disk drive cage with a shielding member for preventing EMI (Electro Magnetic Interference).

2. General Background

In a computer or a server, a drive cage is provided to receive disk drives. However, space in the drive cage is often not fully utilized. A void is thus formed that may allow EMI to radiate therefrom. So, a shielding member is needed to cover the void. Generally, the shielding member includes a shielding cover made of steel and a bezel made of plastic attached on the shielding cover. Usually, a bezel is secured to a shielding cover by melting a portion of the bezel with a melting tool and pressing the bezel to the shielding cover. It is inconvenient to use the melting tool to assemble the bezel and the shielding cover together.

What is needed, therefore, is a disk drive cage having a shielding member, a bezel, and a shielding cover which can be conveniently assembled together.

SUMMARY

A disk drive cage comprises a bracket and a shielding member. The bracket comprises a top wall and a securing wall parallel to the top wall. The securing wall defines a plurality of securing holes therein. The shielding member comprises a shielding cover and a bezel attached to the shielding cover. The shielding cover defines a plurality of cross-shaped slots. Each cross-shaped slot comprises a first slot and a second slot crossing the first slot. A receiving area is defined in a crossing portion formed by the first and second slots. The bezel comprises a plurality of securing posts interferentially engaging in the plurality of cross-shaped slots, and a plurality of hooks engaging with the securing holes of the securing wall of the bracket. Each securing post comprises a securing portion. The securing portion is larger in cross-section than the receiving area. The shielding member is mounted between the top wall and the securing wall.

Other advantages and novel features will be drawn from the following detailed description of an embodiment with attached drawings, in which:

DETAILED DESCRIPTION

Figure 1:
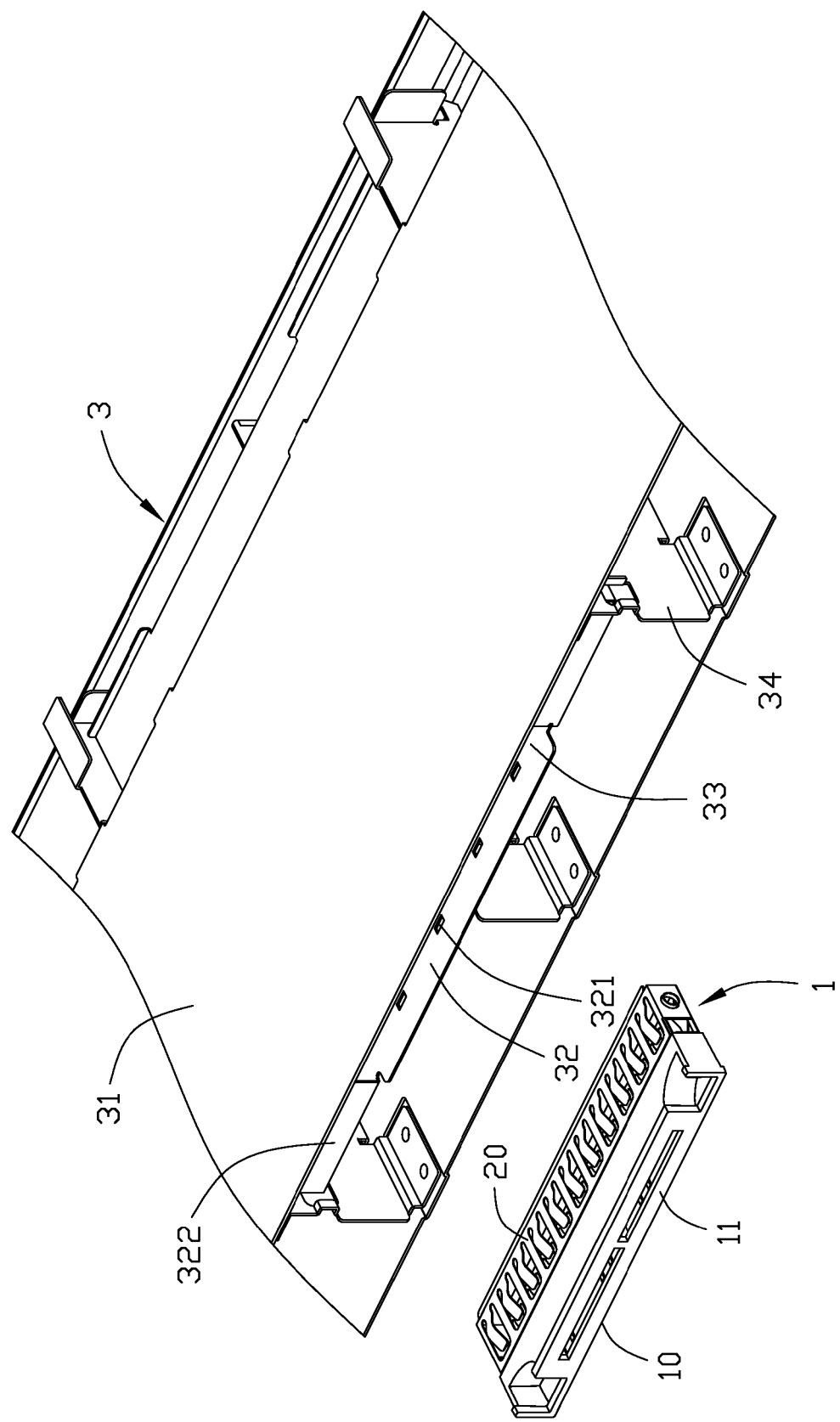
FIG. 1 is an exploded, isometric view of a disk drive cage of an embodiment of the present invention, the disk drive cage including a bracket and a shielding member.

Referring to FIG. 1, a disk drive cage of a preferred embodiment of the present invention includes a bracket 3 for receiving a plurality of disk drives (not shown) therein, and a shielding member 1 for preventing EMI.

The bracket 3 includes a top wall 31 and a securing wall 32 parallel to the top wall 31. The securing wall 32 defines a plurality of securing holes 321 therein. A pair of plates 322 extends up from ends of a front edge of the securing wall 32 respectively. Each plate 322 is perpendicular to the securing wall 32 and contacts the top wall 31. A receiving room 33 is enclosed by the pair of plates 322, the top wall 31, and the securing wall 32, for holding the shielding member 1.

Figure 2:
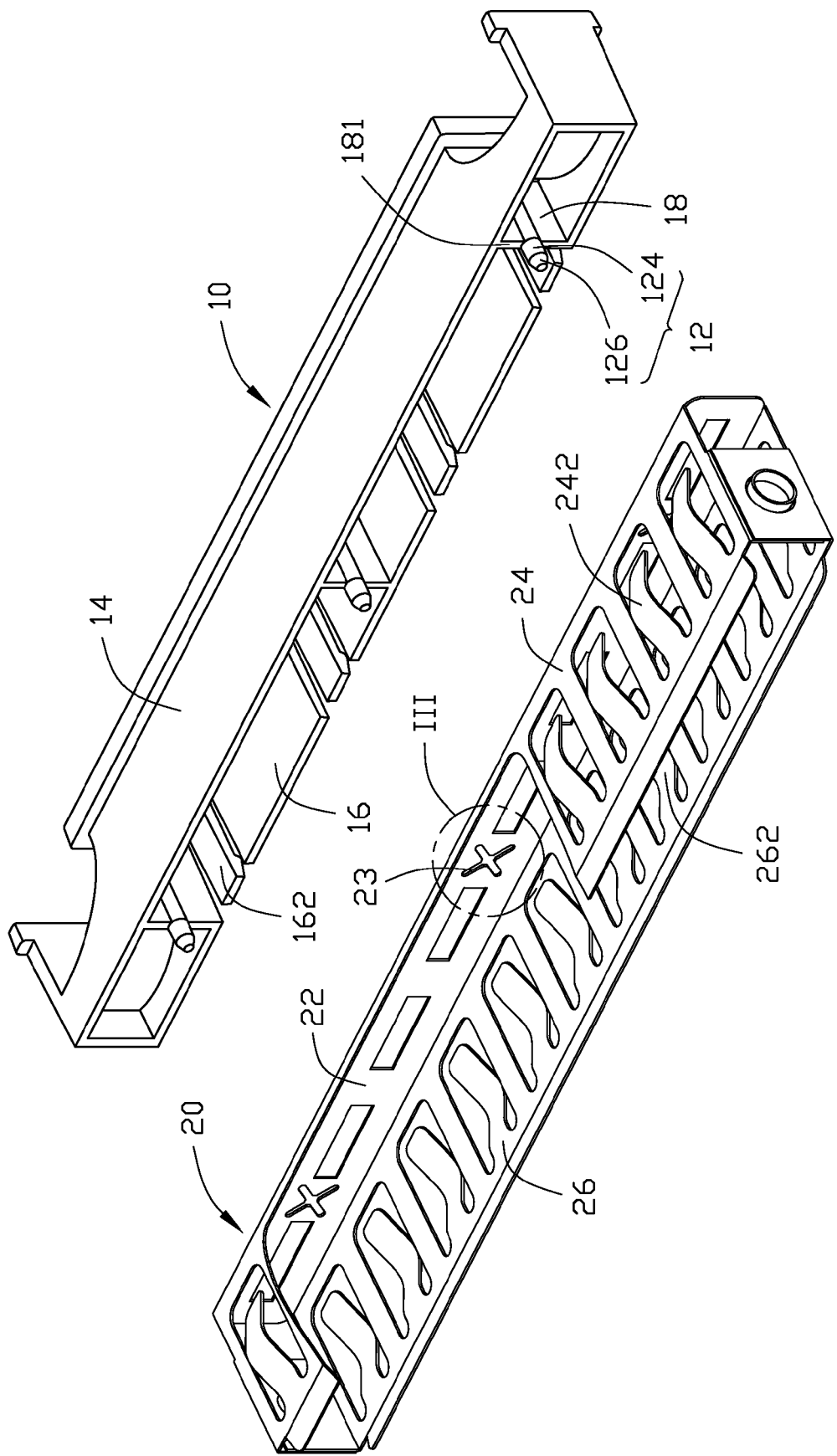
FIG. 2 is an exploded, isometric view of the shielding member of FIG. 1, but viewed from another aspect.
Figure 3:
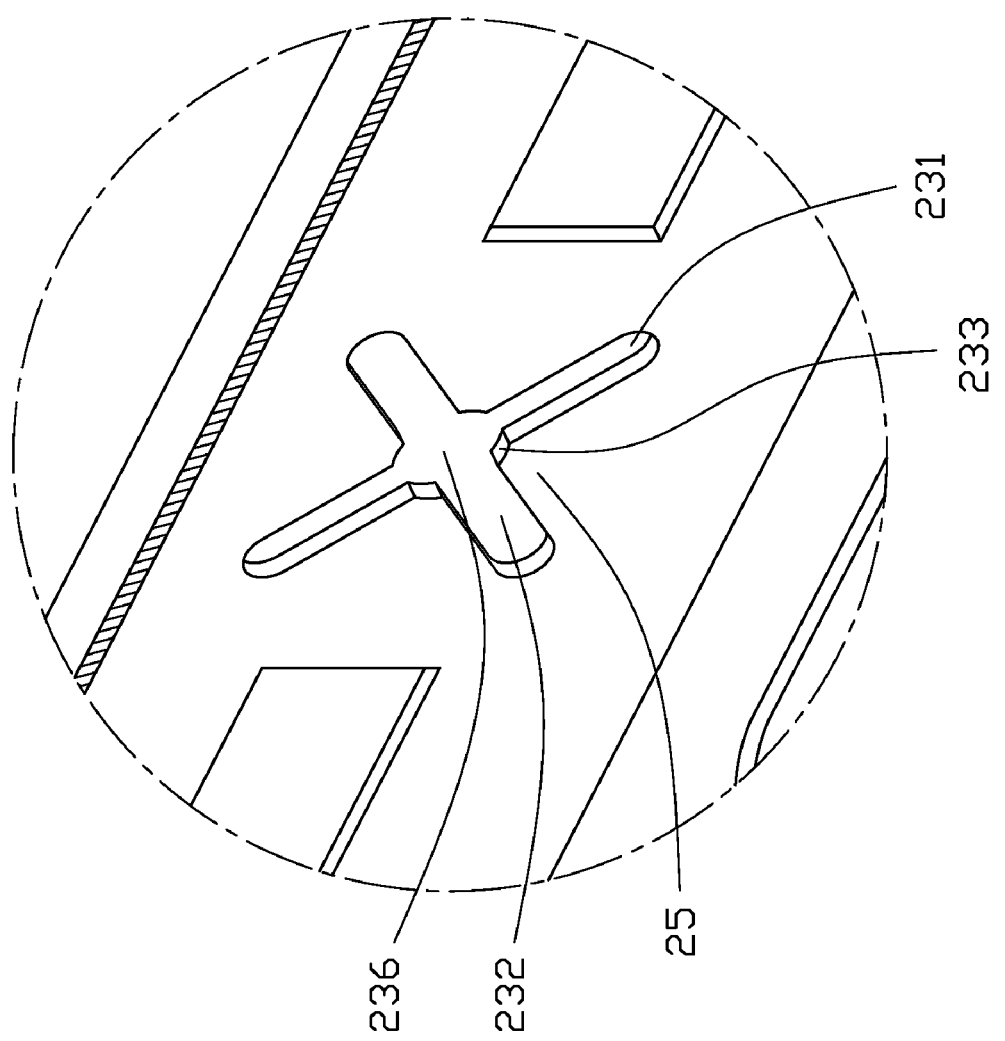
FIG. 3 is an enlarged view of an encircled portion III of the shielding member of FIG. 2.
Figure 4:
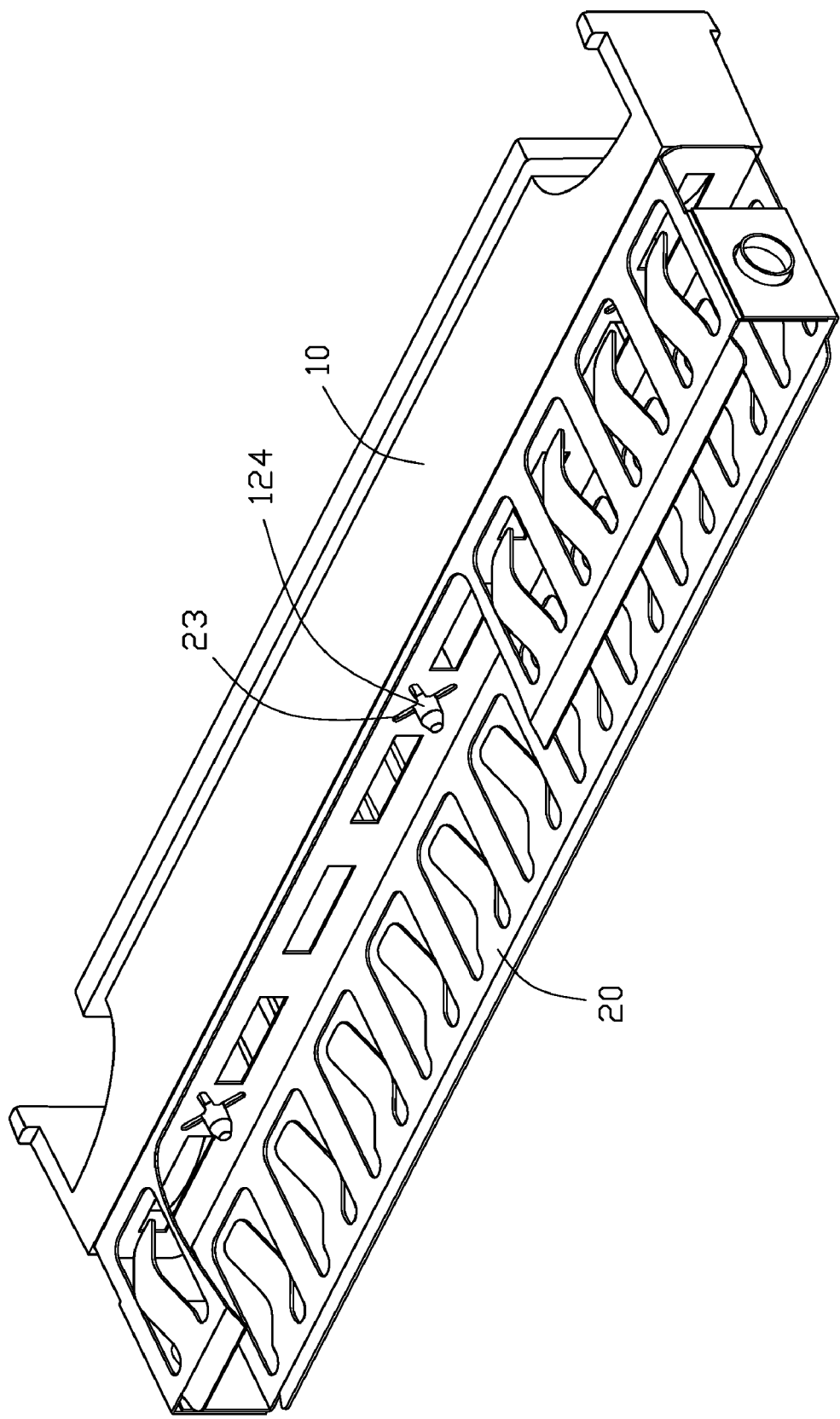
FIG. 4 is an assembled view of FIG. 2.

Referring to FIGS. 1 to 3, the shielding member 1 includes a bezel 10 and a shielding cover 20. The bezel 10 includes a front panel 11, a top panel 14, and a bottom panel 16. A plurality of plates 18 is connected between the top panel 14 and the bottom panel 16. Each plate 18 has an outer edge 181 facing the shielding cover 20. A securing post 12 protrudes from each outer edge 181 of the plates 18. Each securing post 12 includes a cylindrical securing portion 124 and a guiding portion 126 extending from a free end of the securing portion 124. The guiding portion 126 is a truncated cone. A plurality of hooks 162 is formed from the bottom panel 16 for engaging with the plurality of securing holes 321 of the securing wall 32 of the bracket 3 respectively.

The shielding cover 20 includes a front wall 22, a top wall 24, and a bottom wall 26. The top wall 24 and the bottom wall 26 respectively have a plurality of resilient fingers 242, 262 slantingly extending out of the shielding cover 20. Free ends of the resilient fingers 242, 262 are bent in. The front wall 22 defines a plurality of cross-shaped securing slots 23 therein corresponding to the securing post 12. Each securing slot 23 includes a first slot 231 and a second slot 232 crossing the first slot 231. An arc-shaped edge 233 is connected between two adjacent edges of the first and second slots 231, 232. A resilient tab 25 is enclosed by the two adjacent edges of the first and second slots 231, 232, and the arc-shaped edge 233 therebetween. A receiving area 236 is defined in the crossing portion formed by the first and second slots 231, 232 of each securing slot 23 and enclosed by four arc-shaped edges 233 of each securing slot 23. Each receiving area 236 is slightly smaller in cross section than the securing portion 124 of the securing posts 12.

Referring to FIGS. 1 to 4, in assembly of the shielding member 1, the securing posts 12 of the bezel 10 align with the receiving areas 236 of the securing slots 23 of the shielding cover 20 respectively. The bezel 10 is moved towards the shielding cover 20 to enable the securing posts 12 to be inserted into the receiving area 236 of the securing slots 23. When the securing portion 124 of each securing post 12 resists against the corresponding arc-shaped edges 233 to push the resilient tabs 25 around the corresponding receiving area 236, the resilient tabs 25 are pressed to be deformed inwards to form a larger area than the receiving area 236 for the securing portion 124 of the securing post 12 passing therethrough. The securing posts 12 of the bezel 10 are pushed to further insert into the receiving areas 236 of the securing slots 23 of the shielding cover 20 respectively until the outer edges 181 of the plates 18 abut against an outer surface of the front wall 22 of the shielding cover 20. The resilient tabs 25 clamp against the outer surface of the corresponding securing post 12 due to elastic force thereof. The bezel 10 is thus secured on the shielding cover 20.

Figure 5:
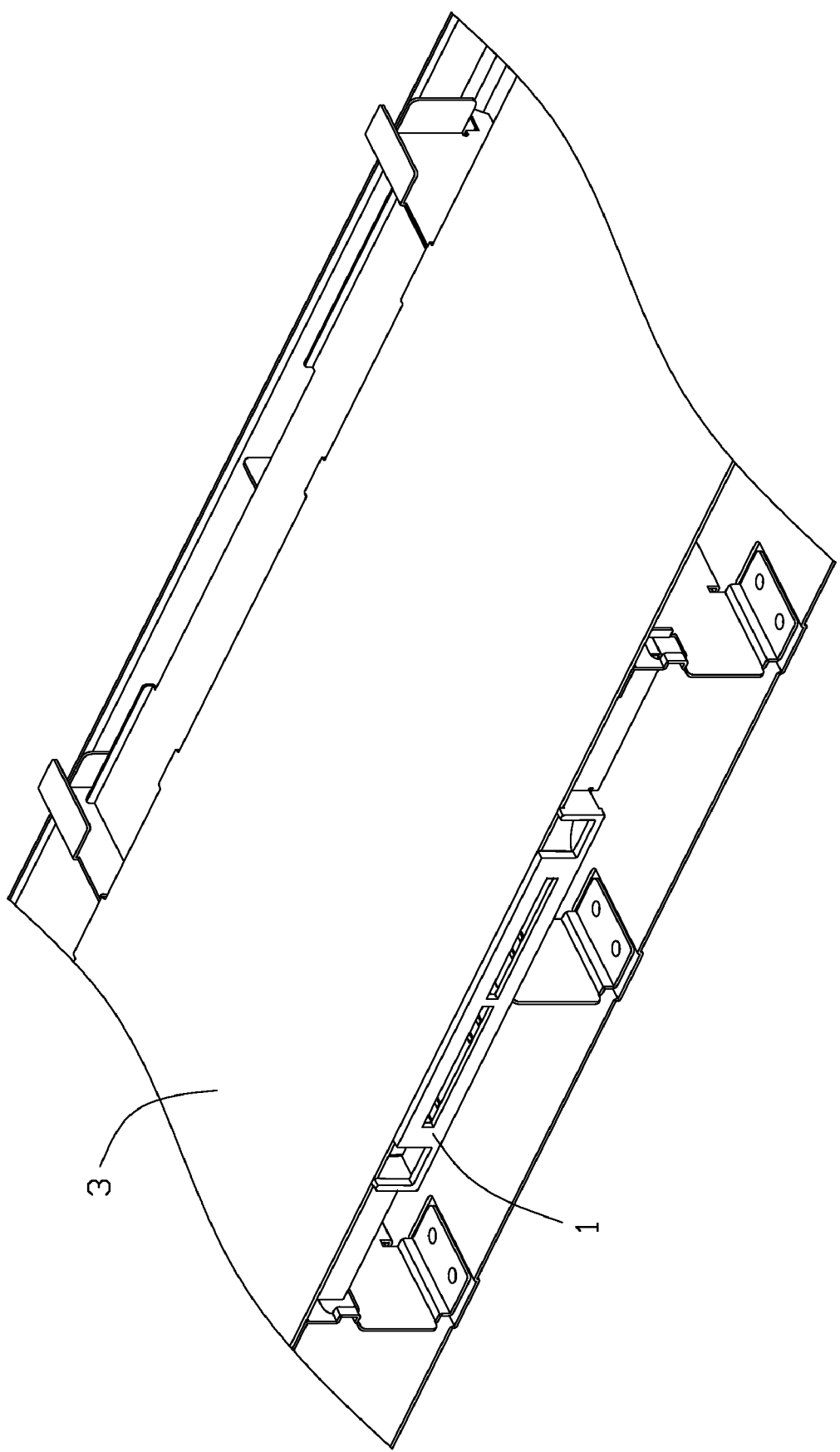
FIG. 5 an assembled view of FIG. 1.

Referring to FIGS. 1, 2, and 5, in assembly of the shielding member 1 to the bracket 3, the shielding member 1 is aligned with the receiving room 33 of the bracket 3. The shielding member 1 is then moved into the receiving room 33 of the bracket 3. The hooks 162 of the bottom panel 16 of the bezel 10 of the shielding member 1 resist against the securing wall 32 of the bracket 3 to be deformed. The shielding member 1 is further pushed into the receiving room 33 of the bracket 3 until the hooks 162 engage with the securing holes 321 of the securing wall 32 respectively, thereby securing the shielding member 1 to the bracket 3.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shielding member comprising:
    a shielding cover comprising a front wall, the front wall defining a plurality of cross-shaped slots therein, each cross-shaped slot comprising a first slot and a second slot crossing the first slot, a receiving area defined in a crossing portion formed by the first and second slots; and
    a bezel comprising a plurality of securing posts interferentially engaging in the plurality of slots respectively, each securing post comprising a securing portion, the securing portion of each securing post larger in cross-section than the receiving area of each cross-shaped slot of the shielding cover.

2. The shielding member as described in claim 1, wherein an arc-shaped edge is connected between two adjacent edges of the first and second slots, a resilient tab enclosed by the adjacent edges of the first and second slots and the arc-shaped edge.

3. The shielding member as described in claim 1, wherein each securing post further comprises a guiding portion extending from a free end of the securing portion, the securing portion being cylindrical, the guiding portion being a truncated cone.

4. The shielding member as described in claim 1, wherein the bezel comprises a front panel, a top panel, and a bottom panel, and a plurality of plates connected between the top panel and the bottom panel, each plate having one of the securing posts on an outer edge thereof facing the shielding cover.

5. A disk drive cage comprising:
    a bracket comprising a top wall and a securing wall parallel to the top wall, the securing wall defining a plurality of securing holes therein; and
    a shielding member comprising a shielding cover and a bezel attached to the shielding cover, the shielding cover defining a plurality of cross-shaped slots, each cross-shaped slot comprising a first slot and a second slot crossing the first slot, a receiving area defined in a crossing portion formed by the first and second slots, the bezel comprising a plurality of securing posts interferentially engaging in the plurality of cross-shaped slots respectively, and a plurality of hooks engaging with the securing holes of the securing wall of the bracket respectively, each securing post comprising a securing portion, the securing portion larger in cross-section than the receiving area, the shielding member mounted between the top wall and the securing wall.

6. The disk drive cage as described in claim 5, wherein an arc-shaped edge is connected between two adjacent edges of the first and second slots, a resilient tab enclosed by the adjacent edges of the first and second slots and the arc-shaped edge.

7. The disk drive cage as described in claim 5, wherein each securing post further comprises a guiding portion extending from a free end of the securing portion, the securing portion being cylindrical, the guiding portion being a truncated cone.

8. The disk drive cage as described in claim 5, wherein the shielding cover comprises a front wall, a top wall, and a bottom wall, and have a plurality of resilient fingers, the front wall defining the plurality of cross-shaped slots therein.

9. The disk drive cage as described in claim 5, wherein the bezel comprises a front panel, a top panel and a bottom panel, and a plurality of plates connected between the top panel and the bottom panel, each plate having one securing post on an outer edge thereof facing the shielding cover.

10. A disk drive cage comprising:
    an EMI shielding cover having a top wall, a bottom wall and a front sidewall connected between the top wall and the bottom wall, the front sidewall having a plurality of X-shaped slots, each of the X-shaped slots comprising a first slot and a second slot intersecting the first slot; and
    a bezel attached to the front sidewall of the EMI shielding cover, the bezel comprising a plurality of securing posts interferentially engaging in the X-shaped slots, and a plurality of hooks; and
    a bracket for receiving a disk drives therein, the bracket comprising a top plate and a supporting plate parallel to the top plate, and a plurality of securing holes defined in the supporting plate with the securing posts of the bezel engaged therein, the EMI shielding cover and the bezel sandwiched between the top plate and the supporting plate with the bezel exposed to an exterior of the bracket.

* * * * *